United States Patent
Rixain

(10) Patent No.: US 10,044,324 B2
(45) Date of Patent: Aug. 7, 2018

(54) POWER AMPLIFIER DEVICE WITH CONTROLLED ENVELOPE TRACKING MODULATOR AND ADAPTED STATIC VOLTAGE

(71) Applicant: Alcatel Lucent, Boulogne Billancourt (FR)

(72) Inventor: Michel Rixain, Nozay (FR)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 15/102,105

(22) PCT Filed: Nov. 25, 2014

(86) PCT No.: PCT/EP2014/075457
§ 371 (c)(1),
(2) Date: Jun. 6, 2016

(87) PCT Pub. No.: WO2015/082248
PCT Pub. Date: Jun. 11, 2015

(65) Prior Publication Data
US 2016/0308494 A1     Oct. 20, 2016

(30) Foreign Application Priority Data

Dec. 6, 2013   (EP) .................................. 13306675

(51) Int. Cl.
*H03F 3/04* (2006.01)
*H03F 1/02* (2006.01)
(Continued)

(52) U.S. Cl.
CPC ......... *H03F 1/0233* (2013.01); *H03F 1/0238* (2013.01); *H03F 1/0272* (2013.01);
(Continued)

(58) Field of Classification Search
CPC ........................................................ H03F 1/32
(Continued)

(56) References Cited

U.S. PATENT DOCUMENTS 6,166,598 A     12/2000   Schlueter
6,678,507 B1 *  1/2004   Kurokawa .............. H03F 3/195
                                                                330/127
(Continued)

FOREIGN PATENT DOCUMENTS

CN      1282141        1/2001
CN     102710223      10/2012
(Continued)

OTHER PUBLICATIONS

International Search Report for PCT/EP2014/075457 dated Feb. 5, 2015.

*Primary Examiner* — Khanh V Nguyen
*Assistant Examiner* — Khiem Nguyen
(74) *Attorney, Agent, or Firm* — Fay Sharpe, LLP

(57) ABSTRACT

This invention relates to a power amplifier device comprising an amplifier component (A) operable to receive an input signal (s;) and to provide an amplified output signal (so), according to a control signal (ctrl), an envelope tracking modulator (ET), providing the control signal (ctrl) according to a static voltage (V s) and a dynamic voltage (V D), a power supply (S) providing said static and dynamic voltages according to measurements performed by a power sensor (PS) on the amplified output signal, so that the static voltage (Vs) is determined as a mean value of the output signal (So) over a predetermined time duration.

13 Claims, 2 Drawing Sheets

(51) Int. Cl.
*H03F 1/56* (2006.01)
*H03F 3/24* (2006.01)
*H04B 1/04* (2006.01)
*H04B 1/18* (2006.01)

(52) U.S. Cl.
CPC ............... *H03F 1/56* (2013.01); *H03F 3/24* (2013.01); *H03F 3/245* (2013.01); *H04B 1/0458* (2013.01); *H04B 1/18* (2013.01); *H03F 2200/378* (2013.01); *H03F 2200/387* (2013.01); *H03F 2200/393* (2013.01); *H03F 2200/465* (2013.01); *H04B 2001/0408* (2013.01)

(58) Field of Classification Search
USPC .................................................. 330/296, 136
See application file for complete search history.

(56) References Cited

U.S. PATENT DOCUMENTS

| | | |
|---|---|---|
| 2010/0250993 A1 | 9/2010 | Drogi |
| 2012/0214431 A1 | 8/2012 | Kanno et al. |

FOREIGN PATENT DOCUMENTS

| | | |
|---|---|---|
| EP | 2 288 021 A1 | 2/2011 |
| GB | 2 356 095 A | 9/2001 |
| JP | 2005-513943 | 5/2005 |
| JP | 2008-124947 | 5/2008 |
| JP | 2012-175286 | 9/2012 |

* cited by examiner

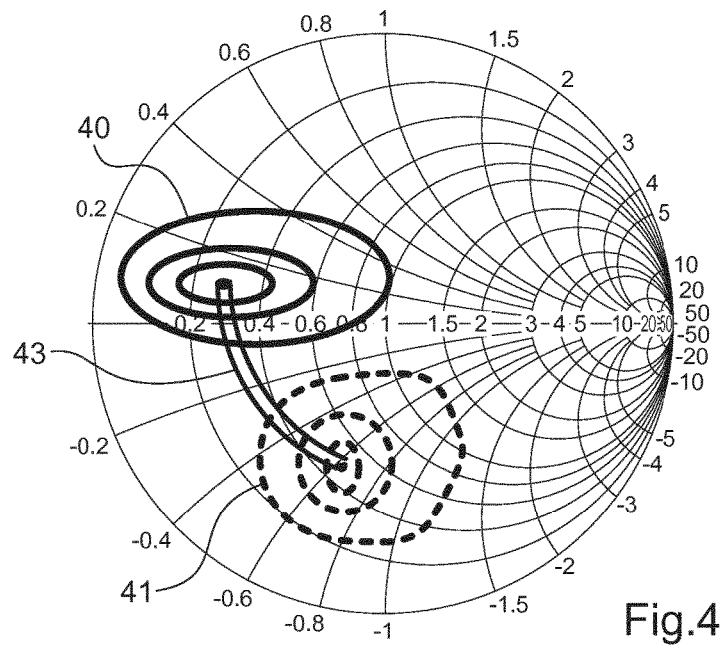
Fig.4
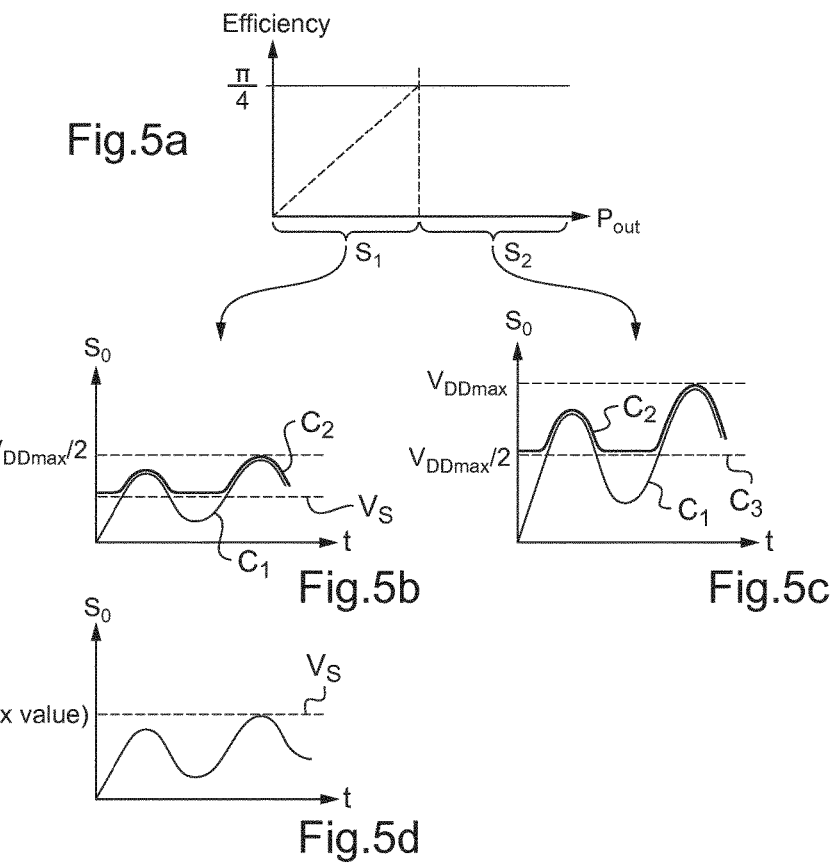

POWER AMPLIFIER DEVICE WITH CONTROLLED ENVELOPE TRACKING MODULATOR AND ADAPTED STATIC VOLTAGE

FIELD OF THE INVENTION

The present invention relates generally to signal amplification and, more particularly, to a device and a method for increasing the efficiency of an amplification device.

BACKGROUND OF THE INVENTION

Wireless devices use radio frequencies (RF) to transmit information. For example, cell phones use amplified RF to transmit voice and data signals to base stations, which allows signals to be relayed to communication networks. Other existing wireless communication devices include Wifi, Bluetooth, WLAN, 3G/4G devices, UMTS and its Long-Term Evolution (LTE) . . . .

In a conventional wireless device, the power amplifier consumes most of the power of the overall wireless system. For systems that run on batteries, a power amplifier with a low efficiency results in a reduced communication time for a given battery life. In addition, a decrease in efficiency results in increased requirements for heat removal, which may increase the equipment and operating costs and may decrease the life time of some components. Furthermore, saving energy is a tremendous need for communication operators contributing to the green movement.

For this reason, much effort has been expended in increasing the efficiency of RF power amplifiers.

A commonly used type of amplifier is the Doherty-type power amplifier.

This type of power amplifier was designed by W. H. Doherty in 1936.

During decades, the modulation schemes (AM and FM) employed required linear amplification. Despite its good efficiency, the Doherty amplifier was not used because of its nonlinearity.

In recent years, the resurgence of popularity of the Doherty amplifier is based on its very high power-added efficiency when amplifying input signals with high PAR (Peak-to-Average Ratio), like for instance OFDM (Orthogonal Frequency Division Multiplexing) signals. In such contexts, the reasonable non-linearity of the Doherty amplifier can be compensated by analog and digital techniques.

However, it is still desirable to improve further the efficiency of the power amplifier of a telecommunication device, notably for the reasons mentioned previously.

SUMMARY OF THE INVENTION

The object of the present invention is to alleviate at least partly the above mentioned drawbacks.

This object is achieved with a power amplifier device, comprising:
An amplifier component operable to receive an input signal and to provide an amplified output signal according to a control signal;
An envelope tracking modulator, providing said control signal according to a static voltage and a dynamic voltage;
A power supply providing said static and dynamic voltages according to measurements performed by a power sensor on said amplified output signal, so that said static voltage is determined as a mean value of said output signal over a predetermined time duration.

Preferred embodiments comprise one or more of the following features, which can be taken separately or together, either in partial combination or in full combination:
The power amplifier device further comprises a matching circuit for keeping said amplifier component in operating conditions corresponding to peak efficiency, according to measurements performed by said power sensor.
The power sensor is a RMS sensor.
The predetermined time duration is dramatically higher than the duration of the variations of said dynamic voltage, notably by a factor of approximately one billion.
The matching circuit comprises a component beholding to a group constituted by a PIN diode, a varicap diode, MEMS . . . .
The enveloper tracking modulator is of a sort produced by the company Emerson.
The output signal is compliant with WCDMA or LTE standard.

Another aspect of the invention concerns a telecommunication device comprising a power amplifier device as previously described.

Another aspect of the invention concerns a method for amplifying an input signal comprising:
Providing an amplified output signal from said input signal according to a control signal;
Providing said control signal according to a static voltage and a dynamic voltage;
Providing said static and dynamic voltages according to measurements performed by a power sensor on said amplified output signal, so that said static voltage is determined as a mean value of said output signal over a predetermined time duration.

Preferred embodiments of this method comprise one or more of the following features, which can be taken separately or together, either in partial combination or in full combination:
The method further comprises keeping said amplifier component in operating conditions corresponding to peak efficiency, according to measurements performed by said power sensor.
The power sensor is a RMS sensor.
The predetermined time duration is dramatically higher than the duration of the variations of said dynamic voltage, notably by a factor of approximately one billion.
Keeping said amplifier component in operating conditions consists in deploying a matching circuit comprising a component beholding to a group constituted by a PIN diode, a varicap diode, MEMS . . . .
Said control signal (ctrl) is provided according to a static voltage ($V_S$) and a dynamic voltage ($V_D$) by a tracking modulator (ET) which is of a sort produced by the company Emerson.
Said output signal ($s_o$) is compliant with WCDMA or LTE standard Further features and advantages of the invention will appear from the following description of embodiments of the invention, given as non-limiting examples, with reference to the accompanying drawings listed hereunder.

BRIEF DESCRIPTION OF THE DRAWINGS

FIG. 4 shows the influence of the adaptation of the static voltage and of the matching on a Smith chart.

FIGS. 5a, 5b, 5c, 5d show an example of curves showing the behavior of a power amplifier device.

DETAILED DESCRIPTION OF THE INVENTION

In general, power amplifier devices comprise or are made of an amplifier component A. This amplifier can be made of a transistor and is operable to receive an input signal and to provide an amplified output signal.

This transistor can be based on a LDMOS (Laterally Diffused Metal Oxyde Semiconductor) or on VDMOS (Vertically Diffused Metal Oxyde Semiconductor), CMOS (Complementary Metal Oxyde Semiconductor), GaAs (Gallium Arsenide) or GaN (Gallium Nitride) technologies.

According to the technology which is used for the amplifier component A, the voltage ranges for the static and dynamic voltages and for the matching, which will be later described, are adapted.

The transistor under Envelope Tracking (ET) can be in class A, B, C, D, E, F, F-1.

Amplifier components of the market have some typical technical characteristics for architecture dedicated to the Envelope tracking: in general, they are designed so that the curve giving the efficiency according to the voltage is flat within a given interval of the voltage.

Figure 2:
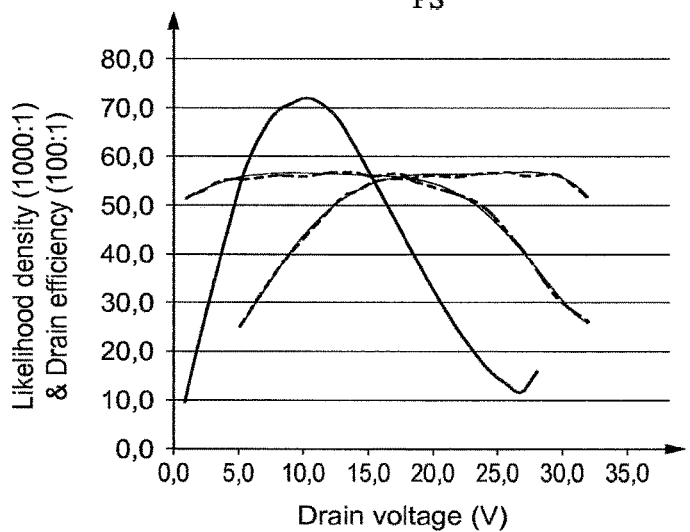
FIG. 2 shows likelihood density and drain efficiency versus the drain voltage for the amplifier.

This characteristic is for instance depicted on the FIG. 2, wherein the curve b represents the drain efficiency versus a drain voltage for an amplifier made of a LDMOS transistor. It clearly shows that the curve is flat within an interval, approximately [17 V; 28 V].

Such a characteristic is interesting when the amplified signal behold to this flat zone, since the efficiency is then maximum. However, in a telecommunication network, the power signal may vary and its excursion may also go out of this zone. In such a case, the efficiency drops dramatically.

In the example shown on this FIG. 2, the curve a represents the likelihood density or probability density function (PDF). Such a function represents the statistic distribution of the voltage: according to the transmitted data signal and to the modulation scheme, the voltage is not distributed equally but, on the contrary, shows an important peak around 10 V.

This value corresponds typically to signals with a large modulation like WCDMA (Wideband Code Division Multiple Access) or LTE (Long Term Evolution).

In other words, there is a high probability to have signals at 10 V, but such signals correspond to poor efficiency (around 45), whereas the efficiency is at its highest value (around 55) for voltage values corresponding to low probability of occurrence.

Consequently, the overall efficiency of such an arrangement is far from optimum.

Accordingly, one aim of the invention consists in modifying the operating conditions of the amplifier component so as to make match the probability density function and the efficiency curve. Simply and graphically stated, it means to move the curve b so that the peak of the curve a corresponds to the flat zone: such a modification of the operating conditions may result, in the depicted example, in the curve c.

For this reason, the amplifier component is controlled to modify its operating conditions according to the amplified output signal.

Accordingly, the amplified output signal is measured by a power sensor to feed regulation signals back for modifying these operating conditions.

Figure 1:
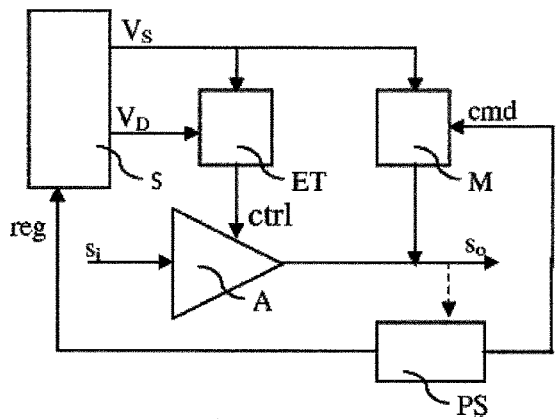
FIG. 1 shows an embodiment for a power amplifier device according to the invention.

FIG. 1 shows an embodiment for a power amplifier device according to the invention.

In this embodiment, the amplifier component A is operable to receive an input signal $s_i$ and to provide an amplified output signal $s_o$, according to a control signal ctrl provided by an envelope tracking modulator ET.

Such an envelope tracking modulator ET can be an off-the-shelf product like, for instance, the one designed by the company Emerson.

A description of this kind of products and techniques is for example available on the homepage of the company Emerson:

https://www.powerconversion.com/assets/whitepapers/EnvelopeTracking-WP0.pdf

This envelope tracking modulator has two inputs: a dynamic voltage $V_D$ and a static voltage $V_S$. Both voltages are provided by a power supply S according to measurements performed by a power sensor PS on the amplified output signal $s_o$.

By doing so, a feedback control is performed from to measured output signal towards the amplifier, so that the amplifier component A is continuously in the operating conditions where the efficiency is maximum, regardless of the output signal.

This is made possible by modifying the static voltage $V_S$ directly according to a mean value of the output signal $s_o$ over predetermined time duration.

Although modified dynamically, this static voltage $V_S$ should still be considered as "static" because its variation over time is dramatically slower than the dynamic voltage $V_D$: the dynamic voltage follows the output signal $s_o$ in real time. On the contrary the static voltage is determined as a mean value over a time period of 70 microseconds (i.e. around the symbol time in a LTE implementation) up to 1 second or so.

The modification of static voltage $V_S$ aims in adapting the amplifier device to the network conditions which directly impact the output power and output voltage $V_o$. For instance, if the amplifier device is put in place within a base station of a telecommunication network, the output power will vary depending on the number of mobile device connected at a given time.

However, this number and thus this output power vary with a rhythm which is completely different from the variations of the transmitted signals themselves (which are captured by the control signal ctrl).

Consequently the predetermined time duration according to which the mean value is determined is dramatically longer than the duration of the variations of the control signal ctrl, notably by a factor of approximately from 14 thousands to ten billion.

The determination of a mean value for the static voltage $V_S$ can be simply performed by a RMS sensor (for "root mean square"). Such kind of power sensor is commonly used in telecommunication systems and is adapted to determine a measured output power regardless of the type of signal modulation which is used.

Both static and dynamic voltages, $V_S$, $V_D$ can be provided by a power supply S which takes as inputs a regulation signal reg, outputted by the power sensor PS on the basis of the measurements and representative of these measurements. Accordingly, the static and dynamic voltages can be adapted to the variations of the output signal $s_o$.

The power supply S can also provide a command signal, cmd, to tune a matching circuit M. The aim of this matching circuit is to keep the amplifier A in operating conditions corresponding to its peak efficiency.

Figure 3A:
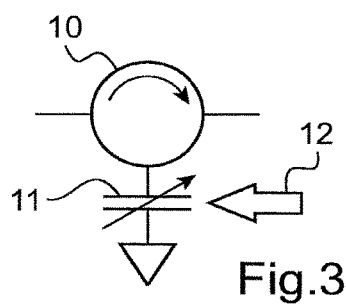
FIGS. 3a, 3b and 3c show possible embodiments for the matching circuit.
Figure 3B:
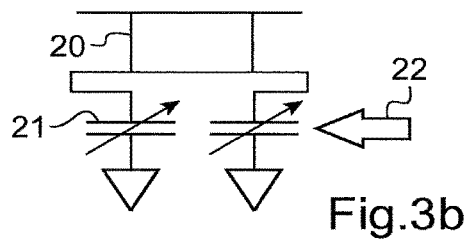
Figure 3C:
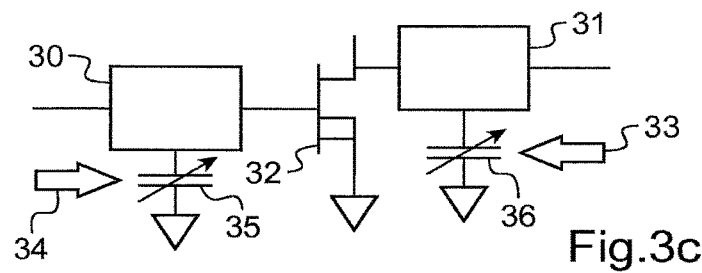

Different embodiments are possible for the matching circuit M. FIGS. 3a, 3b and 3c show possible embodiments.

On FIG. 3a, an isolator 10 is put at the output of the amplifier component A. The third port is let unmatched thanks to the component 11. This component 11 can be PIN diodes, varicap diodes, MEMS . . . . The component 11 has to be compliant with the high power level.

On FIG. 3b, a hybrid coupler 20 is put at the output of the amplifier component A. The input port is let unmatched as in the previous example, thanks to the component 21. Again, this component can be PIN diodes, varicap diodes, MEMS . . . .

On FIG. 3c, the two matching networks of the amplifier component A are modified thanks to the added components 35 and 36. These components can be PIN diodes, varicap diodes, MEMS . . . .

FIG. 4 represents the influence of the adaptation of the static voltage $V_S$ and of the matching on a Smith chart. On this chart, for one constant static voltage $V_S$, each closed curve represents the same transistor efficiency for different impedance values. All these curves form a same family. The smallest curve is for the maximum efficiency and is located the closest around the center of the family. The continued lines 40 represent a first family corresponding to a high value for the static voltage $V_S$ and the dashed lines 40 represent a second family corresponding to a low value for the static voltage $V_S$.

The double lines 43 represent the path of the family centers from low to high values of the static voltage $V_S$. The amplifier component A is matched by the matching circuit M so that impedances are kept along this path to maintain the maximal efficiency.

Turning back to FIGS. 3a, 3b and 3c, it means that the components 11, 21, 35, 36 has modified impedance in accordance to the path depicted on the Smith chart so that the efficiency of the amplifier component A is kept at its maximum value.

FIGS. 5a, 5b, 5c, 5d show an example of curves showing the behavior of a power amplifier device.

FIG. 5a depicts a theoretical curve showing the efficiency of the power amplifier device under Envelope Tracking (ET) according to the output power $P_{out}$.

The dashed line splits the output power $P_{out}$ domain into two sub-domains, a first one, S1, at the left corresponding to low values for the output power and voltage and to the FIG. 5b; and a second one, S2, at the right corresponding to high values of the output power and voltage and to FIG. 5c.

On FIG. 5c, the curve $C_1$ represents the signal envelope and the curve $C_3$ represents the static voltage $V_S$. The envelope tracking modulator ET delivers a drain voltage corresponding to the control signal ctrl. This control signal is illustrated by the curve $C_2$ which follows (i.e. "tracks") the envelope $C_1$, when this signal is over the static voltage $C_3$, and is limited by this static voltage $C_3$ when the signal is below its value.

As a result of this behavior, the efficiency is maximal and the curve on the right sub-domain of the FIG. 5a is a flat curve.

FIG. 5d show a potential situation where no adaptation of the static voltage $V_S$ is undertaken for low value of the static voltage. Such a situation is not compliant with the invention and described here only for making explanations clearer and easier to understand. This figure shows than when decreasing the output voltage, it becomes at one point completely below the constant static voltage at $V_{DDMAX}/2$.

In such a situation, the efficiency of the amplifier decreases dramatically and this loss of efficiency is depicted on FIG. 5a but the dotted line on the left sub-domain.

Thanks to the invention, the static voltage is not constant anymore but is dependent on the output power. FIG. 5b shows a situation where the static voltage has been decreased for a low value of the output voltage. Accordingly, the situation becomes similar with the one depicted on FIG. 5b in the sense that the output signal $C_2$ can track the signal envelope $C_1$ where it is above the static voltage $V_S$ and be limited by it when the envelope drops below. This way, the efficiency is kept maximal as this is depicted by the flat continuous line of the left sub-domain on FIG. 5a.

The invention has been described with reference to preferred embodiments. However, many variations are possible within the scope of the invention.

The invention claimed is:

1. A power amplifier device, comprising:
   an amplifier component configured to receive an input signal and to provide an amplified output signal, according to a control signal;
   an envelope tracking modulator configured to provide said control signal according to a static voltage and a dynamic voltage;
   a power supply configured to provide said static and dynamic voltages according to measurements performed by a power sensor on said amplified output signal, so that said static voltage is determined as a mean value of said output signal over a predetermined time duration; and,
   a matching circuit comprising at least one component configured to present an impedance which is modifiable to reach a value belonging to a path comprising a plurality of values, the path based on: (i) low values of the static voltage, and (ii) high values of the static voltage;
   wherein said reached value corresponds, on a Smith chart, to peak amplifying efficiency of the input signal for the static voltage provided by the power supply.

2. The power amplifier device according to claim 1, wherein said power sensor is a RMS sensor.

3. The power amplifier device according to claim 1, wherein said predetermined time duration is higher than the duration of the variations of said dynamic voltage by a factor of approximately one billion.

4. The power amplifier device according to claim 1, wherein said matching circuit comprises a PIN diode, a varicap diode, or a MEMS.

5. The power amplifier device according to claim 1, wherein said envelope tracking modulator is of a sort produced by the company Emerson.

6. The power amplifier device according to claim 1, wherein said output signal is compliant with WCDMA or LTE standard.

7. A telecommunication device comprising the power amplifier device according to claim 1.

8. A method for amplifying an input signal comprising:
   providing an amplified output signal from said input signal according to a control signal;
   providing said control signal according to a static voltage and a dynamic voltage;
   providing said static and dynamic voltages according to measurements performed by a power sensor on said amplified output signal, so that said static voltage is determined as a mean value of said output signal over a predetermined time duration;

with a matching circuit, presenting a modifiable impedance; and, modifying said impedance to reach a value belonging to a path comprising a plurality of values, the path based on: (i) low values of the static voltage, and (ii) high values of the static voltage;

wherein said reached value corresponds, on a Smith chart, to peak amplifying efficiency of the input signal for the static voltage provided by a power supply.

9. The method according to claim 8, wherein said power sensor is a RMS sensor.

10. The method according to claim 8, wherein said predetermined time duration is higher than the duration of the variations of said dynamic voltage by a factor of approximately one billion.

11. The method according to claim 8, wherein the matching circuit comprises a PIN diode, a varicap diode, or a MEMS.

12. The method according to claim 8, wherein said control signal is provided according to a static voltage and a dynamic voltage by a tracking modulator which is of a sort produced by the company Emerson.

13. The method according to claim 8, wherein said output signal is, compliant with WCDMA or LTE standard.

* * * * *